United States Patent [19]

McAdams

[11] Patent Number: 5,301,160

[45] Date of Patent: Apr. 5, 1994

[54] COMPUTER INCLUDING AN INTEGRATED CIRCUIT HAVING A LOW POWER SELECTION CONTROL ARRANGEMENT

[75] Inventor: Hugh P. McAdams, McKinney, Tex.

[73] Assignee: Texas Instruments Incorporated, Dallas, Tex.

[21] Appl. No.: 840,418

[22] Filed: Feb. 24, 1992

[51] Int. Cl.[5] ............................................... G11C 5/14
[52] U.S. Cl. .............................. 365/226; 365/230.03; 365/230.06
[58] Field of Search ............... 365/203, 204, 226, 227, 365/229, 230.03, 230.06

[56] References Cited

U.S. PATENT DOCUMENTS

| | | | |
|---|---|---|---|
| 4,317,181 | 2/1982 | Teza et al. | 364/707 |
| 4,584,672 | 4/1986 | Schutz et al. | 365/203 |
| 5,128,896 | 7/1992 | Yamada et al. | 365/203 |

OTHER PUBLICATIONS

Digital System Design and Microprocessors; McGraw-Hill Book Company; Author: John P. Hayes. The 80286 Microprocessor Hardware, Software, and Interfacing; Prentice Hall; Authors: Walter A. Triebel and Avtar Singh.

Primary Examiner—Eugene R. LaRoche
Assistant Examiner—Frank R. Niranjan
Attorney, Agent, or Firm—Richard B. Havill; Richard L. Donaldson

[57] ABSTRACT

A computer system includes a data processor; an address bus; a data bus; row and column decoding circuits; an integrated circuit memory device interconnected with the data processor by way of the address and data buses, the memory device having a pair of bitlines including parts, a sense amplifier, selectable transfer gates between the bitline parts and sense nodes of the sense amplifier, a selection circuit that enables transmission through the transfer gates in response to address signals. The selection circuit provides either a precharge voltage to the transfer gates during a precharge state or high and low level signals to the transfer gates when selecting a transfer gate. During transition to the precharge state, a charge transfer path is enabled for transferring charge from one transfer gate lead to another transfer gate lead. Thereby a substantial quantity of charge is conserved during operation.

13 Claims, 5 Drawing Sheets

COMPUTER INCLUDING AN INTEGRATED CIRCUIT HAVING A LOW POWER SELECTION CONTROL ARRANGEMENT

FIELD OF THE INVENTION

This invention relates to a computer system and more particularly to a computer system having large scale integrated circuits arranged to operate at low power consumption.

BACKGROUND OF THE INVENTION

A computer system is an arrangement which receives information, or data, from one or more data sources, processes the data through a routine to produce a result, and transmits the result to an output device, such as a display, a printer, or another machine that is in communication with the computer system. Computer systems are designed for both general purpose uses and for special purpose uses. They range in size from large ones to small ones, each depending upon its intended use. Small computer systems now include personal computers, such as laptop computers, notebook computers, handheld computers, and plastic card computers.

All of the aforementioned small computers include integrated circuit (IC) devices which are interconnected in some arrangement which processes the data under control of commands provided by a program. Energy, for operating each integrated circuit device, is supplied from an off chip power supply. Some of the small computers are operated by energy supplied from a battery.

The rate of energy, or power, consumption for the small, battery operated, computer is an important system design criteria. Generally the computer system user desires the small computer system to operate from the battery for a duration that is as long as possible Several computer system design techniques help to extend the duration of useful discharge of the battery energy, i.e., to extend the useful battery life between recharge cycles or replacement cycles.

Since each typical small computer system includes several integrated circuit devices, it is very important to design each integrated circuit chip to consume as little energy, or power, as possible Integrated circuit devices, such as dynamic random access memory (DRAM) devices, are used in large numbers in small computer systems. Some dynamic random access memory devices include an on chip high voltage source which generates a voltage $V_{pp}$ that is higher than the voltage $V_{dd}$ applied to the memory device from an off chip voltage source, such as a battery.

The on Chip high voltage source is used for applying the high voltage $V_{pp}$ to the gate electrode of an n-channel, enhancement mode transfer gate transistor, which is interposed between a bitline and a sense node of a sense amplifier. In spite of the threshold voltage drop lost because of the transfer gate transistor, the sense node and the bitline both reach the voltage $V_{dd}$ when desired during operation.

An on chip high voltage converter is used to produce the voltage $V_{pp}$ is higher than the off chip supply voltage $V_{dd}$. Such a high voltage converter is fabricated right in the substrate and therefore uses some chip area. As the density of storage Cells is increased in a memory chip, more and more chip surface is required for the high voltage supply circuits. A lower power and smaller chip area alternative is sought for efficiently boosting the voltage of the gate electrodes of the transfer gate transistors to a magnitude that is higher than the off chip supply voltage $V_{dd}$ and for efficiently returning the magnitude of voltage of the gate electrodes to the precharge voltage $V_{dd}$.

SUMMARY OF THE INVENTION

These and other problems are solved by a computer system having a data processor, an address bus, a data bus, row and column decoding circuits; an integrated circuit memory device interconnected with the data processor by way of the address and data buses, the memory device having a pair of bitlines including parts, a sense amplifier, selectable transfer gates between the bitline parts and sense nodes of the sense amplifier, a selection circuit that enables transmission through the transfer gates in response to address signals. The selection circuit provides either a precharge voltage to the transfer gates during a precharge state or high and low level signals to the transfer gates when selecting a transfer gate. During a transition to the precharge state, a charge transfer path is enabled for transferring charge from one transfer gate lead to another transfer gate lead. Thereby a substantial quantity of charge is conserved during operation.

An integrated circuit memory includes two partial bitlines; a sense amplifier; selectable transfer gates interposed between the partial bitlines and sense nodes of the sense amplifier. A selection circuit enables transmission through the transfer gates in response to address signals. The selection circuit provides either a precharge voltage to the transfer gates during a precharge state or a high level signal to one of the transfer gates when selecting a transfer gate. During a transition to the precharge state, a charge transfer path is enabled for transferring charge from one transfer gate lead to another transfer gate lead thereby conserving a substantial quantity of charge.

BRIEF DESCRIPTION OF THE DRAWINGS

A better understanding of an illustrative embodiment of the invention may be derived by reading the subsequent detailed description with reference to the drawing wherein.

DETAILED DESCRIPTION

Figure 1:
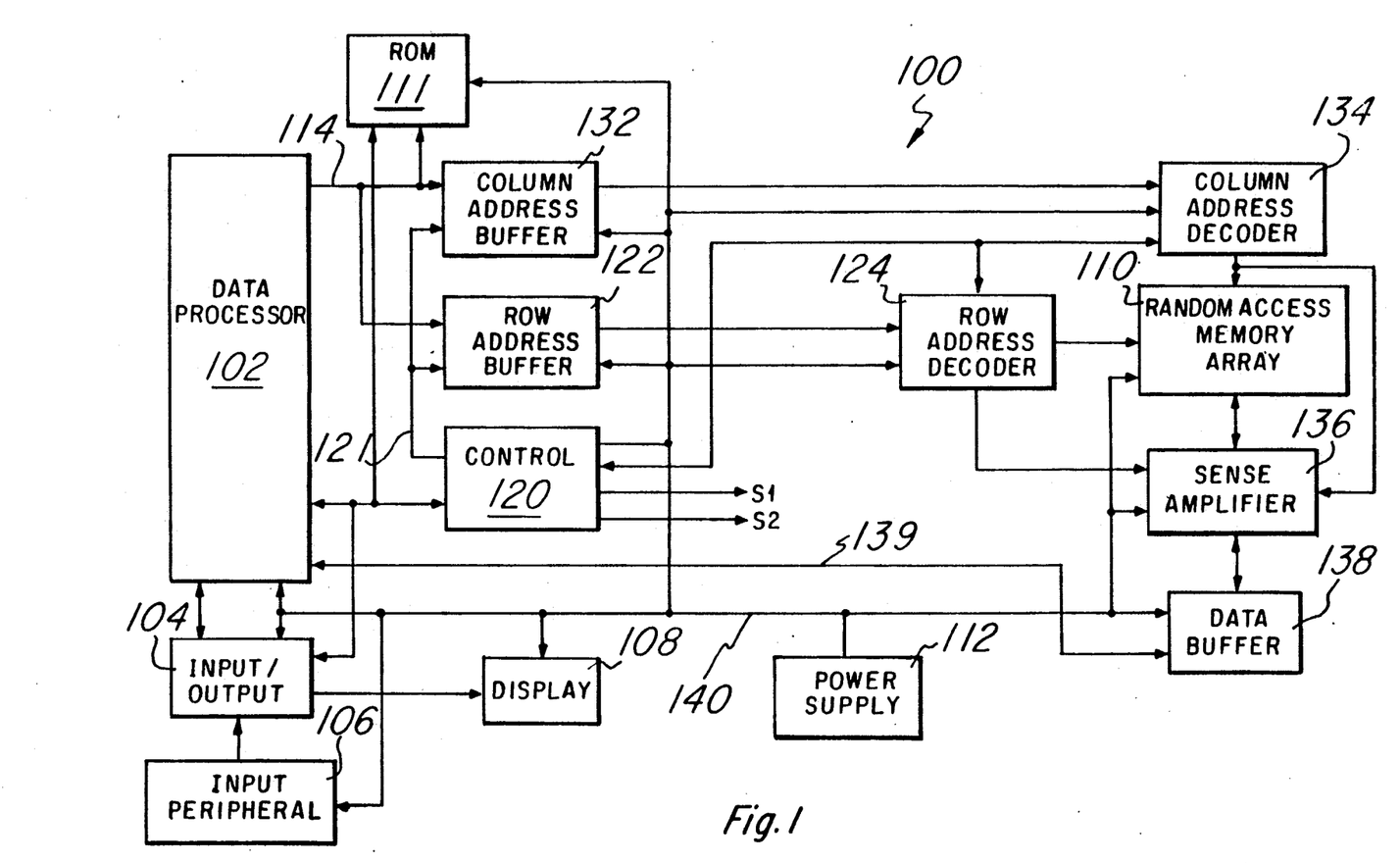
FIG. 1 is a block diagram of a computer system.

Referring now to FIG. 1, there is shown a digital data processing system 100 having parts fabricated as integrated circuits The data processing system 100 may be a laptop, notebook, or another type of portable computer having power supplied by a battery. A data processor 102 is a microprocessor fabricated as an integrated circuit. Input/output circuit 104 also is fabricated as an integrated circuit. An input peripheral device 106 may be a keyboard or other arrangement for inputting data to the data processor 102. Display 108 may a video monitor, a printer, or another device for displaying output information produced by the data processor 102. Memories 110 and 111 are integrated circuit devices arranged for storing information to be used by the data processor 102. A power supply 112 may be an active circuit voltage generator or a battery depending upon the specific use of the data processor system 100. If the data processing system 100 includes a battery power supply, the battery has limited energy and must be recharged or replaced when its energy is depleted.

In FIG. 1, the data processor 102 receives data from either the input peripheral device 106 or from the memories 110 and 111. The data processor 102 operates on the received data in response to instructions from either the random access memory (RAM) 110 or the read only memory (ROM) 111.

To access a storage cell in the random access memory 110 or in the read only memory 111, the data processor 102 generates row and column addresses and applies them over an address bus 114 to row and column buffers 122 and 132 where the respective addresses are held temporarily. Those addresses are latched into the row and column buffers in response to a signal on a lead 121 from a control circuit 120.

The row address is applied from the row address buffer 122 to a row address decoder 124 where it is decoded into a signal for enabling a wordline in the memory array 110 and thereby enabling all storage cells along a row of the memory array 110.

The column address is applied from the column address buffer 132 to a column address decoder 134 where it is decoded into a signal for enabling a column select line YSL in the memory array and thereby activating the selected storage cell at the intersection of the enabled row and the selected column in the memory array 110.

Once the selected storage cell is activated, data can be written into or read out from the selected storage cell in the memory array 110. A similar row and column selection arrangement is appropriate for the read only memory 111, but it is not shown for purposes of simplifying the block diagram.

When data is being read out of the selected storage Cell, a signal representing the stored data is applied to a bitline BL and its complementary bitline $\overline{BL}$, which are not shown in FIG. 1. The signal is gated from the bitline BL and its complementary bitline $\overline{BL}$ to sense nodes in an associated sense amplifier located in a group of sense amplifiers 136. The gating operation is to be described in greater detail hereinafter with respect to FIG. 2.

After data from the memory array 110 is detected by the sense amplifier 136, it is further gated out of the sense amplifier to a data buffer 138. From the data buffer 138, the data is sent by way of a data bus 139 to the data processor 102. Conversely data received by the data buffer 138 from the data processor and the data bus is gated to the sense amplifier 136 and to the memory array 110.

A similar accessing arrangement is used for the read only memory 111, but it is not shown in the block diagram of FIG. 1 to simplify that FIG.

When resultant data is available within the data processor 102, that data is transmitted out of the data processor to the display device 108 or to another output device that is to be controlled by the data processor.

The power supply 112 provides electrical energy to various parts of the data processing system 100. Energy supplied from the power supply 112 is transmitted over a power bus 140 to the data processor 102, to the input /output device 104, the input peripheral 106, to the display device 108, to the random access memory 110, and to the read only memory 111. The power supply 112 is an off chip power supply that may be a battery in such systems as laptop Computers, notebook computers, or other portable computers. Portable computer users desire a long battery life. Longer battery lifetime can be achieved by designing integrated circuit chips with circuits which use less energy than the energy used by prior art integrated circuit arrangements.

Figure 2:
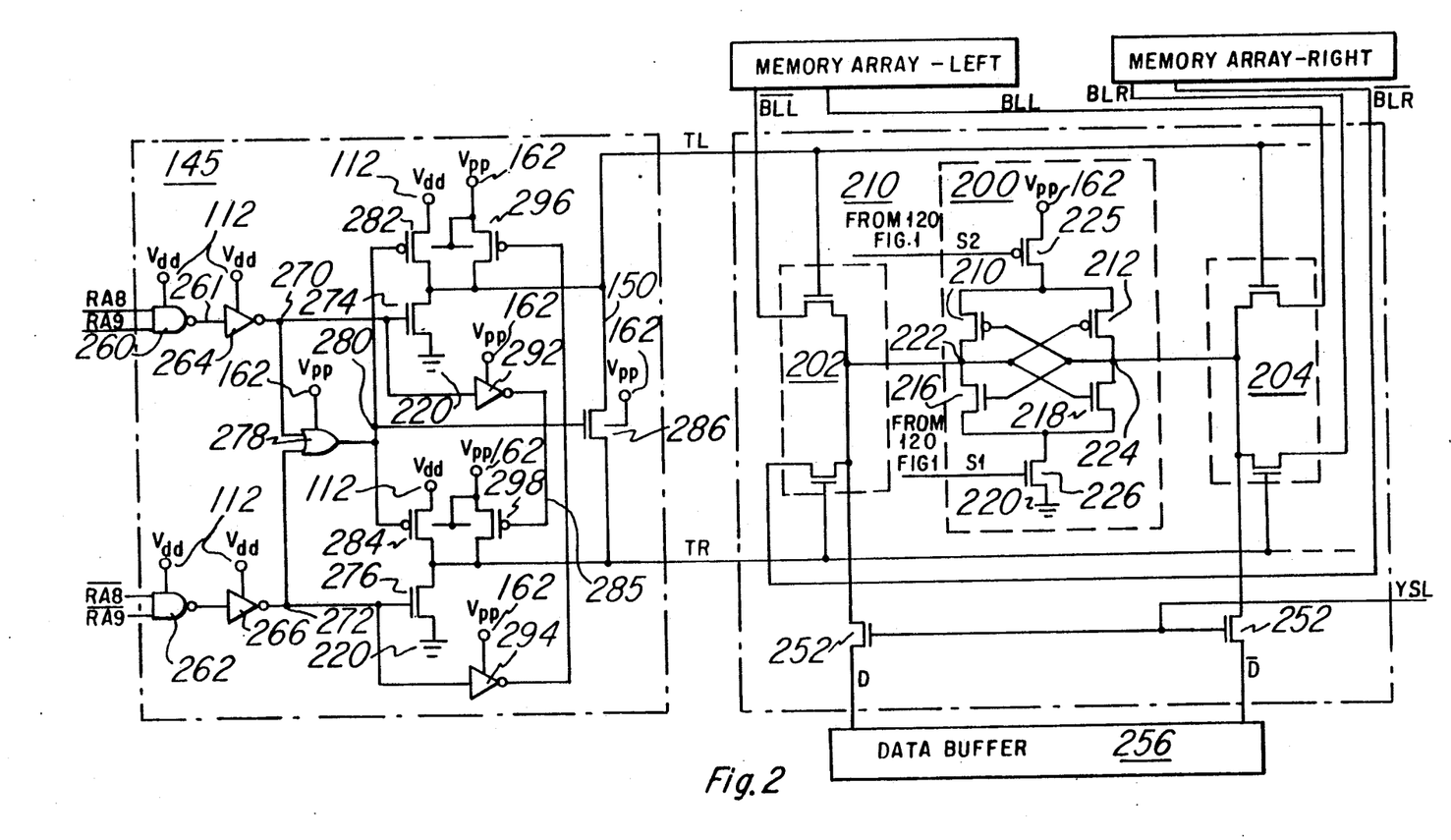
FIG. 2 is a schematic diagram of a low power bitline selection control circuit arrangement.

Referring now to FIG. 2, there is shown a circuit arrangement 145 which uses less energy than the arrangement used for accomplishing memory bitline selection functions in a prior art arrangement. The circuit 145 of FIG. 2 is a bitline isolation, or selection, control circuit which, in contrast to the prior art, includes a charge transfer path 150 connected between transfer control leads TL, TR and a pair of selection circuits for supplying boosted high voltage power to those leads. Power is supplied alternatively from the off-chip voltage supply 112 and an on chip voltage supply 162. This arrangement of FIG. 2 significantly reduces the energy required to select a desired bitline during operation with respect to the energy required by a well known prior art arrangement that will be described hereinafter.

Sense amplifier circuit 200 is isolated from the partial bitlines BLL, $\overline{BLL}$ and BLR, $\overline{BLR}$ by transfer gates 202, 204. The two pairs of transfer gates 202, 204 are used for selectively isolating the sense amplifier circuit 200 from the partial bitlines BLL, $\overline{BLL}$, and BLR, $\overline{BLR}$ and for normally coupling that sense amplifier circuit 200 to the partial bitlines BLL, $\overline{BLL}$, BLR, $\overline{BLR}$. Each pair of transfer gates 202, 204 includes two n channel, enhancement mode MOS transistors which are controlled by signals on transfer control leads TL, TR. The transfer gates 202, 204 are turned on except when a block of memory cells connected with the partial bitlines BLL, $\overline{BLL}$ or BLR, $\overline{BLR}$ needs to be isolated from the sense amplifier circuit 200. Normally, a precharge gate control signal is applied by way of the leads TL and TR to the gates within the transfer gates 202, 204 to couple, for example, the partial bitlines BLL, $\overline{BLL}$ to the sense amplifier circuit 200. When a block of memory cells is to be isolated, a transfer gate control signal is applied by way of either the lead TL or the lead TR to enable selection of two of the gates within the transfer gates 202, 204 to couple, for example, the partial bitlines BLL, $\overline{BLL}$ to the sense amplifier circuit 200. The other two of the gates are disabled for isolating the partial bitlines BLR, $\overline{BLR}$ from the sense amplifier.

The sense amplifier circuit 200 includes a pair of cross-coupled p channel, enhancement mode MOS transistors 210, 212 and a pair of cross coupled n channel, enhancement mode MOS transistors 216, 218. They are connected between an on chip voltage supply $V_{pp}$ and ground reference 220. Sense nodes 222, 224 produce complementary logic signals determined by the sense amplifier circuit 200.

Sense amplifier selection gate transistors 225, 226 are included within the sense amplifier circuit 200 for selectively enabling operation of the sense amplifier. A p channel, enhancement mode MOS transistor 225 is such a selection gate transistor that is interposed between the high voltage supply $V_{pp}$ and the source electrodes of the MOS transistors 210, 212. This selection gate transistor 225 is controlled by a signal $\overline{S2}$ from the control Circuit 120 of FIG. 1. An n channel, enhancement mode MOS transistor 226 is another selection gate transistor. This one is interposed between the MOS transistors 216, 218 and ground 220. Selection gate transistor 226 is controlled by a signal S1 from the control circuit 120 of FIG. 1. The signals S1 and $\overline{S2}$ enable the sense amplifier circuit 200 when it is expected to read data from the bitlines.

Bitline isolation, or selection, control circuit 145, included in the random access memory integrated circuit chip, produces the transfer gate control signals which are applied on the transfer control leads TL, TR. The bitline isolation Control circuit 145 includes two voltage supply selection circuits that are controlled by signals produced from the row address decoder 124 of FIG. 1. A more complete description of the arrangement and operation of the voltage supply selection circuits is presented in a separate patent application (TI-16122), filed concurrently herewith by applicant and assigned to Texas Instruments. Depending upon what section of the memory bitlines is desired to be coupled to the sense amplifier circuit 200, appropriately decoded row address signals are applied to the bitline isolation control circuit 145. Illustratively in FIG. 2, row address select signals RA8, $\overline{RA8}$ and row address selection signals RA9, $\overline{RA9}$ are applied as inputs to the bitline isolation control circuit 145. Other combinations of row address selection signals are applied to other voltage supply selection circuits for selecting other transfer control leads which are not shown.

While the transfer gates 202, 204 couple the bitlines BLL, $\overline{BLL}$ to the sense amplifier circuit 200, data can be read from or written to the circuit 200 by way of input /output gates 252. When active, a column selection signal YSL, applied to those gates, enables the gates to couple the sense nodes 222, 224 of the sense amplifier circuit 200 to a data buffer circuit 256.

During operation of the bitline isolation control circuit 145, there is a precharge state and an active state. Power is supplied from an off-chip voltage supply $V_{dd}$ and from an on-chip voltage supply $V_{pp}$. For the precharge state, the voltage on both of the transfer control leads TL, TR is held at the voltage $V_{dd}$ of the off-chip voltage supply. All row address signals applied to the leads RA8, RA9, $\overline{RA8}$, and $\overline{RA9}$ are low during the precharge state. During the active state, the voltage on one of the transfer control leads is raised to the voltage $V_{pp}$ of the on chip voltage supply, and the other is discharged to the ground reference 220. For the active state, one pair and only one pair of row address signals on leads, such as the leads RA8 and RA9, goes high while the complementary signals on the leads $\overline{RA8}$ and $\overline{RA9}$ remain low.

Beginning with the precharge state wherein all four of the input signals are low, the two combinations of NAND gates 260, 262 and inverters 264, 266 produce low logic levels on two circuit nodes 270, 272. These nodes 270, 272 being at the low logic level, cause n channel, enhancement mode MOS transistors 274, 276 to turn off. An OR gate 278, responsive to the low logic levels on the nodes 270, 272, produces a low logic level output on a node 280 which connects with gate electrodes of p channel, enhancement mode MOS transistors 282, 284. Consequently, the MOS transistors 282, 284 are turned on allowing a capacitive load, e.g., the transfer gates, connected to the transfer control leads TL, TR to charge to the voltage $V_{dd}$ of the voltage supply 112. The low logic level on the node 280 also is applied to a gate electrode of a charge transfer p channel, enhancement mode MOS transistor 286 which is turned on. This charge transfer MOS transistor 286 is enabled for equalizing the charge on the two transfer control leads TL, TR.

Also during the precharge state, a pair of inverter circuits 292, 294 invert the low logic levels on the nodes 270, 272 to the high voltage level $V_{pp}$ apply signals at that level to p channel, enhancement mode MOS transistors 296, 298 turning them off. This disabling of the MOS transistors 296, 298 assures that no leakage occurs from the high voltage $V_{pp}$ the on chip voltage supply 162 to the transfer control leads TL, TR.

During the precharge state, the bitline isolation control circuit 145 stabilizes and applies the supply voltage $V_{dd}$ over the transfer control leads TL, TR to the gate electrodes of transfer gates 202, 204. In this precharge state, the bitline isolation control circuit waits for the memory address decoder to apply an address signal which selects the illustrated transfer gates 202, 204.

It is interesting to note that the bitline isolation control circuit will remain in the precharge state even though some different address signals are applied, as previously mentioned. For the NAND gate input logic arrangement, each NAND gate 260, 262 will produce a high logic level for any address signal combination other than both address signal inputs to the gate being high. The NAND gate 260, however, receives two address signals which, when active, are complements of the two address signals applied to the inputs of the NAND gate 262. When in an active state, only one of the NAND gates 260, 262 can produce a low logic level output at a time.

Transition into the active state is commenced when the control circuit 120 of FIG. 1 applies a row address strobe ($\overline{RAS}$) signal to the row address decoder 124. If the applied address is decoded so that the two address signals applied to a first one of the NAND gates, e.g., NAND gate 260, are high logic levels, then NAND gate 260 will produce a low logic level output signal. The other NAND gate 262 will continue to produce a high logic level output because it's received address signals are complements of the address signals of the first NAND gate 260. NAND gate 262 will also continue to produce a high logic level output in response to other combinations of applied address signals when at least one of it's received address signals is a low level.

When the bitline isolation control circuit is thus put into an active state, the low logic level signal from the NAND gate 260 causes the inverter 264 to produce a high logic level on the node 270. Node 272 remains at a low logic level. OR gate 278 produces a high logic level on the node 280 and thereby turns off the p channel, enhancement mode MOS transistors 282, 284 of the isolation control circuit and the p-channel, enhancement mode MOS transistor 286 to disable any charge transfer between the two transfer control leads TL, TR.

During this active state, the low logic signal on the node 272 Causes the inverter 294 to maintain a high logic level on the gate electrode of the p channel, enhancement-mode MOS transistor 296, which remains turned off. The high logic level on the node 270, however, turns on the n channel, enhancement mode MOS transistor 274 which discharges the precharge voltage from the transfer Control lead TL to ground reference 220.

Concurrently, the low logic level on the node 272 maintains the turned off state of the n channel, enhancement-mode MOS transistor 276. Also the high logic level on the node 270 is complemented by the inverter 292 to a low logic level, which turns on the p channel, enhancement mode MOS transistor 298. As a result, the MOS transistor 298 conducts current from the on chip high voltage supply 162 to charge the transfer control lead TR to the voltage $V_{pp}$ of the on chip high voltage supply 162. Since the charge transfer path through the MOS transistor 286 is disabled during this active state, the transfer control lead TR goes to the high voltage $V_{pp}$ while the transfer control lead TL goes to ground reference.

If in another active state the applied address signals were reversed so that two high logic level signals are applied to the inputs of the NAND gate 262 and two low logic level signals are applied to the inputs of the NAND gate 260, the bitline isolation control circuit 145 would operate in a complementary manner. As a result, the transfer control leads TL and TR would go to the high logic level and the low logic level, respectively.

After the active state is finished, the bitline isolation control circuit 145 leaves the active state and returns to the precharge state. The circuit is designed to conserve power during the transition from the active state to the precharge state. For a fuller understanding of the saving of power, the following discussion will highlight how power is conserved. Assume that the bitline isolation control circuit is in the first described active state, with the transfer control leads TR and TL at the high logic level and the low logic level, respectively. For purposes of this description, further assume that all of the applied address signals RA8, RA9, $\overline{RA8}$, $\overline{RA9}$ go to the low logic level putting the nodes 270, 272 at the low logic level. These low logic levels turn off the MOS transistors 274, 276 and by way of a low logic level, produced by the OR gate 278 on the node 280, turn on the MOS transistors 282, 284, and 286. The low logic level signals on the nodes 270, 272 also are complemented by the inverter circuits 292, 294, which apply the resulting high logic level signals to turn off the MOS transistors 296, 298.

Immediately because of the relative size of the MOS transistor 286 with respect to the MOS transistors 282, 284, charge is shared, or transferred, from the transfer control line TR through the MOS transistor 286 to the transfer control line TL. The MOS transistor 282 also begins to supply charge from the voltage supply 112 to the transfer control line TL. As a result of these actions, the voltage on the transfer control lead TR dips below the voltage $V_{dd}$ as the voltage on the transfer control lead TL rises toward the voltage $V_{dd}$. Once the voltages on the transfer control leads equalize, the voltage on both leads TL and TR rise and stabilize at the voltage $V_{dd}$ leaving the bitline isolation circuit 145 in the precharge state.

Figure 3:
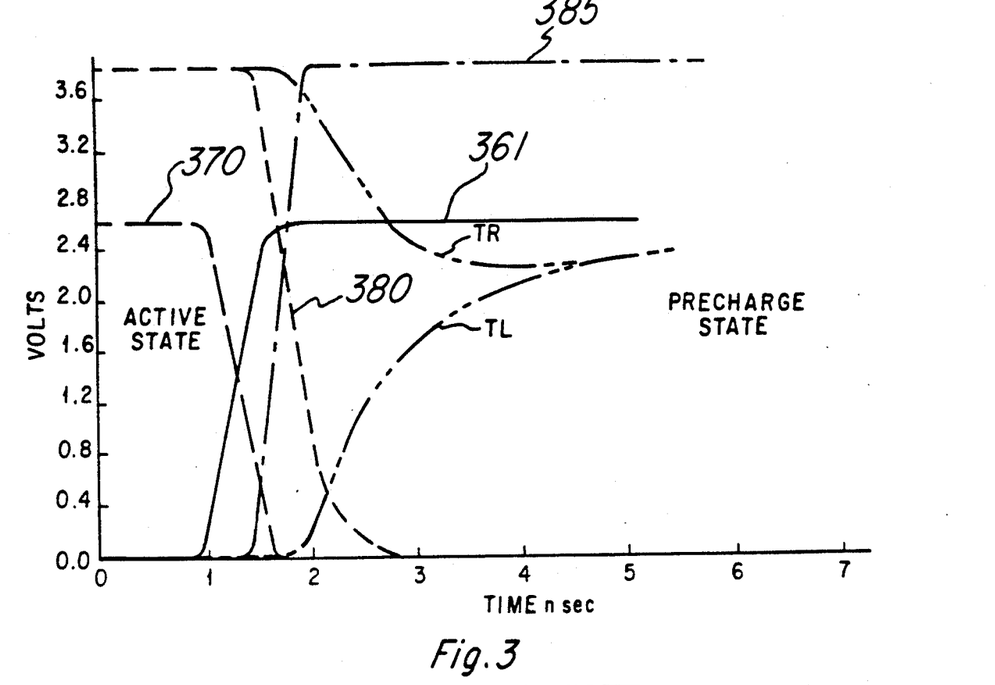
FIG. 3 is a timing diagram of logic levels that occur in various parts of the bitline selection control circuit arrangement of FIG. 2 during operation.

Referring now to FIG. 3, there is shown a plot of operating characteristics of the circuit arrangement of FIG. 2. Curves 361, 370, 380, and 385 represent, respectively the voltages on the nodes 261, 270, 280, and 285 over time. Similarly the curves TR and TL represent, respectively, the voltages on the transfer gate control leads TR and TL.

Now we shall analyze the charge used by the selection circuit arrangement of FIG. 2 during operation. Charge is supplied to the transfer control leads TL and TR when one of those leads is activated and when those two leads are restored to the precharge state.

During the active state, the capacitance C of one lead is raised from precharge voltage $V_{dd}$ to the high voltage $V_{pp}$. As a result the quantity of charge $$Q_A = C(V_{pp} - V_{dd}) \text{ is used.}$$

When the two leads are being restored to the precharge state, the transfer path is enabled. No charge is consumed while charge is transferred from one transfer gate control lead to the other. Once the voltages on the two transfer gate control leads equalize at a voltage $V_{pp}/2$, charge is supplied to raise those voltages to the precharge voltage $V_{dd}$. To thus raise the voltages on the transfer gate control leads to the recharge voltage, a quantity of charge $$Q_P = 2C(V_{dd} - V_{pp}/2) \text{ is used.}$$

The total charge required for the operation is $$Q_T = Q_A + Q_P$$

Assuming that the high voltage $V_{PP} = 3.6v$, the precharge voltage $V_{dd} = 2.6v$ and that the capacitance $C = 1pF$, then the total charge used during a cycle of operation is $$Q_T = C(V_{pp} - V_{dd}) + 2C(V_{dd} - V_{pp}/2)$$
$$= 2.6 \text{ picocoulombs.}$$

Figure 4:
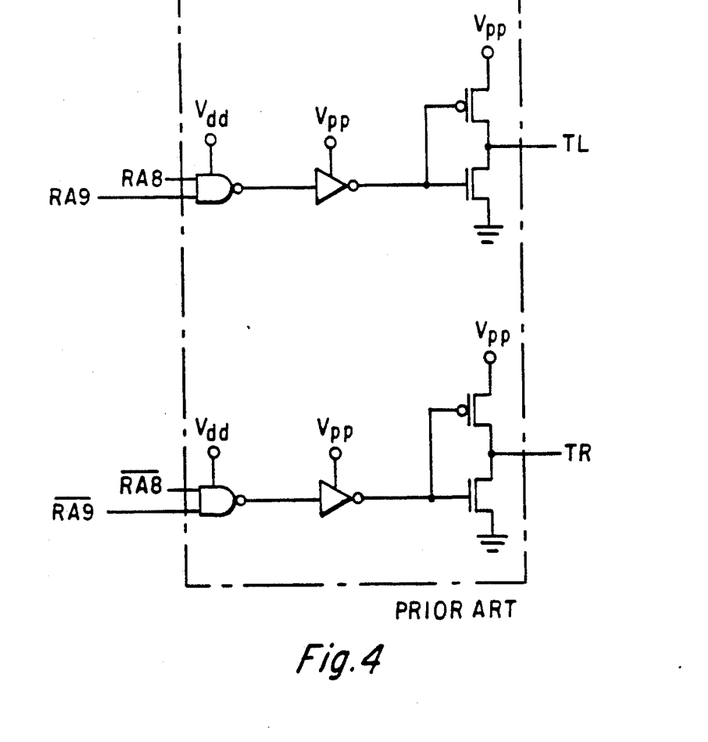
FIG. 4 is a schematic diagram of a prior art bitline selection control circuit arrangement.

Referring now to FIG. 4, there is shown a prior art arrangement for selecting a transfer gate control lead. In this arrangement, all of the charge, required to raise the signal on the selected transfer gate control lead, is supplied from the high voltage supply $V_{pp}$. The capacitance C of the transfer gate control line uses charge $$Q_O = C V_{pp}.$$

Using values of the prior example,
$Q_O = 3.6$ picocoulombs.

Since the arrangement of FIG. 2 transfers charge between transfer control leads and uses only 2.6 picocoulombs versus the 3.6 picocoulombs of the prior art arrangement, a power saving of 28% is realized per selection operation. Additional power is conserved because of the efficiency of using the voltage supply $V_{dd}$ selectively to supply charge. The high voltage supply $V_{pp}$ is used only for raising the transfer gate control leads above the precharge voltage $V_{dd}$. Thus additional power and chip area are conserved as described in the aforementioned patent application (TI-16122).

Figure 5:
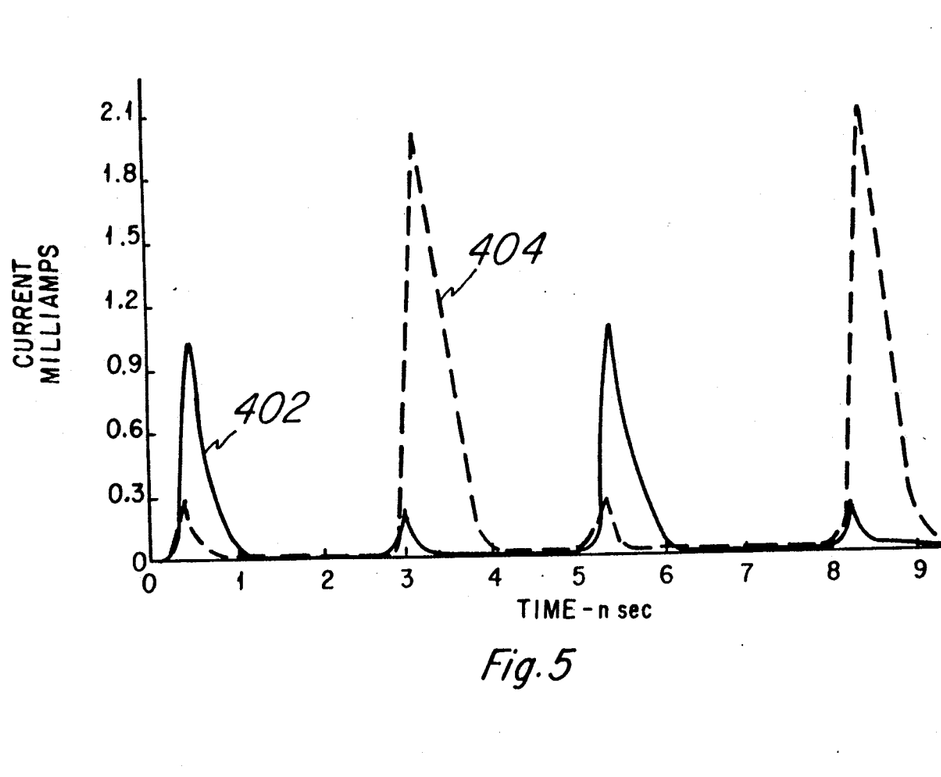
FIGS. 5 and 6 are timing diagrams, respectively, of current flow and charge transfers which occur during operation of the bitline selection control circuit arrangements of FIGS. 2 and 4.
Figure 6:
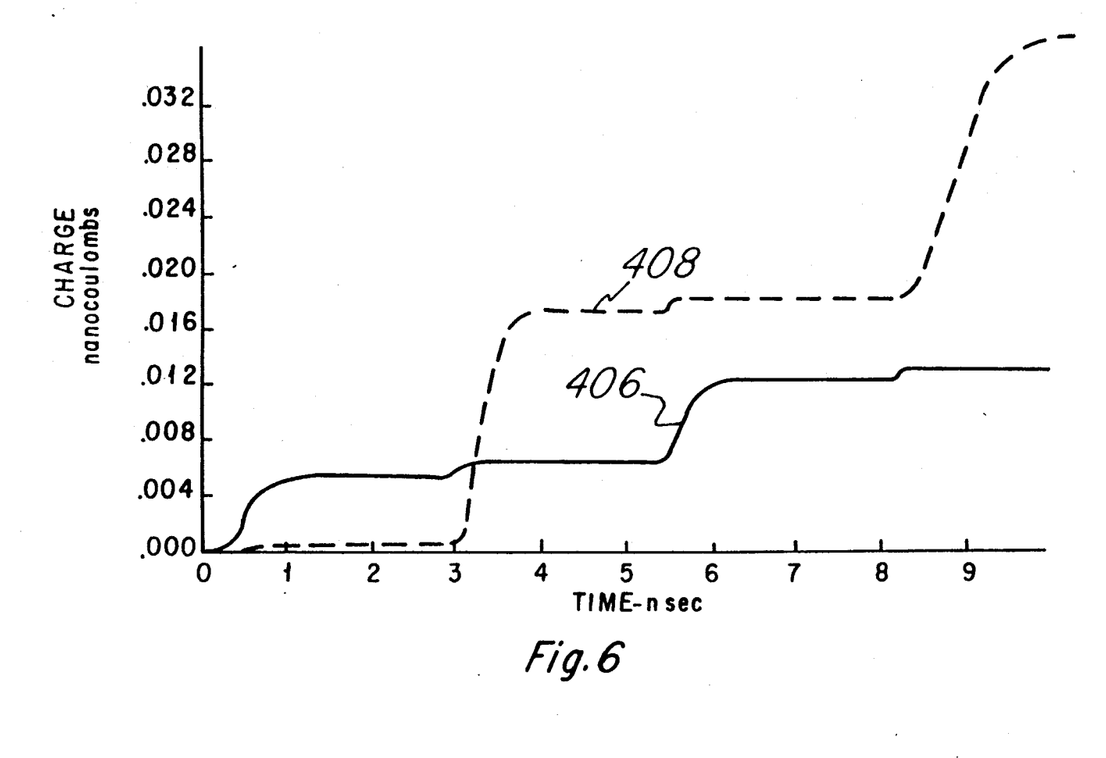

Referring now to FIGS. 5 and 6, there are shown graphs of current supplied 402, 404 and charge delivered 406, 408 over time for the arrangements of FIGS. 2 and 4, respectively. As a result, a longer battery lifetime is expected from the arrangement of FIG. 2.

The bitline isolation, or selection, control circuit 145 of FIG. 2 has been described with respect to use in the random access memory 110 of FIG. 1. Such a control circuit 145 also may be used with respect to the read only memory 111 of FIG. 1. The arrangement for memory 111 is not shown in the figures merely to simplify the drawing and description.

The foregoing describes an illustrative embodiment of the invention. That embodiment together with other embodiments made obvious in view thereof fall within the scope of the appended claims.

What is claimed is:

1. A computer system comprising:
   a data processor;
   an address bus;
   a data bus;
   row and column address decoding circuits;
   an integrated circuit memory device interconnected with the data processor by way of the address and data buses, the memory device including:
   a pair of bitlines, each bitline having first and second parts;
   a sense amplifier with a pair of complementary sense nodes;
   a different selectable transfer gate interposed between each part of each of the bitlines and one of the sense nodes;
   a selection circuit, responsive to an address signal from the column address decoding circuit, for enabling transmission of data through the transfer gates;
   an on chip voltage supply for providing high voltage through the selection circuit and a first transfer control lead to a first pair of the transfer gates during active selection of the transfer gates; and
   a ground reference for providing a low voltage through the selection circuit and a second transfer control lead to a second pair of the transfer gates during active selection of the transfer gates; and
   another voltage supply for providing precharge voltage through the selection circuit and the first and second transfer control leads to the transfer gates during a precharge state of the transfer gates.

2. A computer system, in accordance with claim 1, further comprising:
   the on-chip voltage supply provides a high voltage having a magnitude that is at least a threshold voltage drop greater than the magnitude of the precharge voltage from the other voltage supply; and
   the selection circuit is a bitline isolation control circuit.

3. A computer system comprising:
   a data processor;
   an address bus;
   a data bus;
   row and column address decoding circuits;
   an integrated circuit memory device interconnected with the data processor by way of the address and data buses, the memory device including:
   a pair of bitlines, each bitline having first and second parts;
   a sense amplifier with a pair of complementary sense nodes;
   a different selectable transfer gate interposed between each part of each of the bitlines and one of the sense nodes;
   a selection circuit, responsive to an address signal from the column address decoding circuit, for enabling transmission of data through the transfer gates;
   an on-chip voltage supply for providing high voltage through the selection circuit and a first transfer control lead to a first pair of the transfer gates during active selection of the transfer gates;
   a ground reference for providing a low voltage through the selection circuit and a second transfer control lead to a second pair of the transfer gates during active selection of the transfer gates; and
   a charge transfer gate, connected between the first and second transfer control leads and enabled during the precharge state of the transfer gates, for transferring charge from the first transfer control lead to the second transfer control lead; and
   another voltage supply for providing precharge voltage through the selection circuit and the first and second transfer control leads to the transfer gates during a precharge state of the transfer gates.

4. A computer system, in accordance with claim 3, wherein
   the on chip voltage supply provides a high voltage having a magnitude that is at least a threshold voltage drop greater than the magnitude of the precharge voltage from the other voltage supply; and
   the selection circuit is a bitline isolation control circuit.

5. A computer system, in accordance with claim 4, wherein the precharge voltage supply is located on chip.

6. A computer system, in accordance with claim 4, wherein the precharge voltage supply is located off chip.

7. A computer system, in accordance with claim 4, wherein the precharge voltage supply comprises a battery.

8. A computer system, in accordance with claim 3 or 4, further comprising:
   input circuitry interconnecting with the data processor for inputting data into the data processor and
   output circuitry interconnected with the data processor for displaying output information produced by the data processor.

9. An integrated circuit memory comprising:
   two partial bit lines;
   a sense amplifier with a sense node;
   a pair of selectable transfer gates, each interposed between one partial bitline and the sense node;
   a selection circuit, responsive to a first address signal, for enabling transmission of data selectively through one of the pair of transfer gates;
   an on chip high voltage supply for providing high voltage through the selection circuit and a first one of a pair of transfer control leads to one of the transfer gates during active selection of the one transfer gate;
   a supply voltage node for applying precharge voltage through the selection circuit and the pair of transfer control leads to the transfer gates during a precharge state of the transfer gates; and
   a charge transfer gate, connected between the transfer control leads and enabled in response to a second address signal during the precharge state, for transferring charge from the first transfer control lead to the other transfer control lead.

10. An integrated circuit memory, in accordance with claim 9, wherein
    the selection circuit is a bitline isolation control circuit that includes:
    a pair of voltage supply selection circuits, each voltage selection circuit including a pair of drain coupled, p channel MOS transistors and a selectable n channel MOS transistor for enabling conduction of drain current from the drain electrodes of the p channel MOS transistors to ground;

one of the transfer control leads being connected to the drain electrodes of the p channel MOS transistors; and the p-channel and n channel MOS transistors being responsive to signals derived from the first and second address signals for enabling the MOS transistors to alternatively supply different levels of voltage to the pair of transfer control leads.

11. An integrated circuit memory, in accordance with claim 10, wherein the pair of voltage supply selection circuits supply an on-chip high voltage $V_{pp}$ which has a magnitude that is at least an MOS transistor threshold voltage drop greater than the magnitude of the precharge voltage $V_{dd}$.

12. An integrated circuit memory, in accordance with claim 11, wherein the precharge voltage supply is a voltage regulator located on chip.

13. An integrated circuit memory, in accordance with claim 9, wherein a precharge voltage supply is located on chip.

* * * * *